United States Patent [19]

Gonda

[11] Patent Number: 4,728,908
[45] Date of Patent: Mar. 1, 1988

[54] OSCILLATOR CIRCUIT UTILIZING MULTIPLE SEMICONDUCTOR DEVICES

[75] Inventor: Joseph Gonda, Moultonboro, N.H.

[73] Assignees: American Telephone and Telegraph Company, New York, N.Y.; Bell Telephone Laboratories, Incorporated, Murray Hill, N.J.

[21] Appl. No.: 477

[22] Filed: Jan. 5, 1987

[51] Int. Cl.$^4$ .............................. H03B 5/00
[52] U.S. Cl. .................... 331/108 R; 331/177 V; 307/288; 307/313
[58] Field of Search .......... 331/108 R, 108 A, 108 C, 331/177 V; 307/288, 313, 279, 597

[56] References Cited

U.S. PATENT DOCUMENTS 3,553,484  1/1971  Gassmann ................ 331/108 R X
3,609,592  9/1971  Raval ....................... 331/108 A X

OTHER PUBLICATIONS

"A 20–40-GHz Push–Push Dielectric Resonator Oscillator," IEEE Trans. Microwave Theory and Techniques, vol. MTT-33, No. 12, Dec. 1985, A. M. Pavio et al., pp. 1346–1349.

Primary Examiner—Gene Wan
Assistant Examiner—Robert J. Pascal
Attorney, Agent, or Firm—David R. Padnes

[57] ABSTRACT

An improved oscillator circuit utilizing multiple semiconductor devices, such as field-effect transistors or bipolar transistors, is disclosed. To improve the gain of the oscillator circuit corresponding terminals on each device are interconnected via a path which provides a delay equal to an integer multiple of the inverse of the oscillator frequency. This technique can be adapted to provide an oscillator whose nominal frequency is voltage controllable and can be arranged to provide one or more output ports.

4 Claims, 4 Drawing Figures

OSCILLATOR CIRCUIT UTILIZING MULTIPLE SEMICONDUCTOR DEVICES

TECHNICAL FIELD

The present invention relates to oscillator circuitry employing a plurality of semiconductor devices and, more particularly, to such circuitry especially suitable for high power applications in the high microwave to millimeter wave frequency band.

BACKGROUND OF THE INVENTION

Communications systems exist which utilize a modulated carrier signal having a nominal frequency in the high microwave to millimeter wave frequency band. This frequency range, extending from 18 to 50 gigahertz (GHz), is used or allocated for a variety of systems, including point-to-point and point-to multipoint private radio systems. In such systems, it is generally necessary to provide for electronic adjustment and/or continuous modulation of the oscillator output frequency.

While several different types of oscillator circuit designs are known for generating the requisite modulated carrier signals in the frequency range from 18–50 GHz, they all have limitations which render tham unusable for certain telecommunications applications. For example, one well-known type of oscillator circuit design for this frequency band utilizes Gunn diodes. The problem with these semiconductor devices is that they are not efficient and produce limited output signal power. Another oscillator circuit design uses Impatt diodes. These devices, like Gunn diodes, are inefficient, often require elaborate heat sinking and do not possess the reliability required to meet the objectives of many system applications. Still another oscillator circuit design for different portions of this frequency band utilizes transistor devices, including bipolar transistors and the various varieties of field-effect transistors (FETS), such as insulated-gate FETS (IGFETS) and metal on silicon FETS (MOSFETS). While this class of oscillator circuit designs provides improved efficiency and reliability, the output signal power is limited due to the low gain of these transistor devices in the frequency band above 18 GHz. Prior art attempts to increase the output power have focussed on increasing the area of the transistor device or cascading several such devices in series. Increasing the area of the transistor lowers its impedance and requires matching low impedance levels in the interfacing circuitry. Providing this matching low impedance in the interfacing circuitry produces high circuit losses which substantially negate the effect of increasing the output power. Moreover, cascading two or more transistors in series along with a feedback loop results in a design wherein the oscillator frequency stability oftentimes does not meet system performance objectives. Accordingly, a frequency stable oscillator circuit capable of providing higher output power in the high microwave to millimeter wave frequency band and whose nominal frequency is electronically adjustable would be extremely desirable.

SUMMARY OF THE INVENTION

Pursuant to the present invention, an oscillator circuit which produces higher power in the high microwave to millimeter wave frequency band is provided by interconnecting at least two transistor devices via an interconnecting path which provides a delay equal to an integer multiple of the period of the oscillator output signal. Each of the transistor devices have corresponding terminals and a selected one of these terminals on one device and its counterpart on the other device are interconnected by the delay providing interconnection path. The transistor devices may include bipolar transistors or any of the different varieties of field-effect transistors. The above-described approach may be utilized in arrangements which provide one or more oscillator output signal ports and wherein the nominal oscillator frequency is adjustable by changing the effective length of the delay line. This change can provide precise adjustment of the oscillator frequency or modulation thereof.

DETAILED DESCRIPTION

Figure 1:
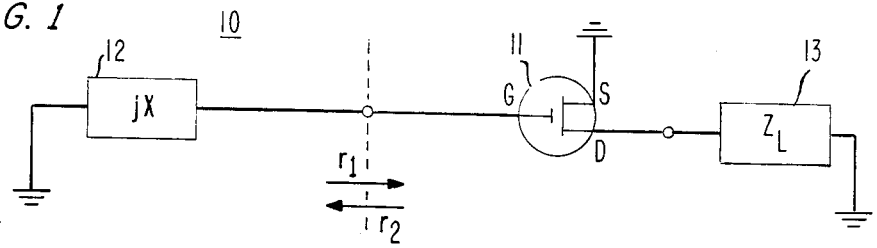
FIG. 1 is a block-schematic diagram of a prior art oscillator circuit.

FIG. 1 shows a prior art oscillator circuit 10, including an FET 11 in a "T" embedding arrangement which provides a nominal frequency in the 18–50 GHz frequency band, FET 11 has gate (G), source (S) and drain (D) terminals which are respectively connected to a reactance element 12 and output load element 13. The reactance of element 12 is designated as jX and the load of element 13 is designated as $Z_L$.

For oscillation, the product of reflection coefficients $r_1$ and $r_2$ must be equal to or greater than 1 at the desired oscillation frequency. More specifically, for oscillation to begin, this product must be greater than 1 at the desired oscillation frequency while to maintain an existing oscillation at this frequency the product must be equal to 1. As shown, $r_1$ is the reflection coefficient looking to the right or into the gate terminal of FET 11 and $r_2$ is the reflection coefficient looking to the left or into the reactance element 12. Because of the low gain of an FET in the frequency range from 18–50 GHz, $|r_1|$ is only slightly greater than 1. Accordingly, the circuit must be designed to set $|r_2|$ as close to 1 as possible. While for an ideal reactance, $|r_2|=1$, in reality, the reactance element 12 is not lossless and $|r_2|$ is less than 1. In addition, for oscillator applications which have to be voltage controllable, the addition of a varactor in series with element 12 adds to the circuit losses. As a result, the product of $r_1$ and $r_2$ is oftentimes less than 1 which is not enough to maintain oscillation. To avoid this result, a substantial portion of the output signal power has to be fed back to the oscillator input. This, however, reduces the output power. Indeed, it is known that an oscillator utilizing semiconductors has limited output power and this power is far less than the output power of the device in amplifier applications.

Figure 2:
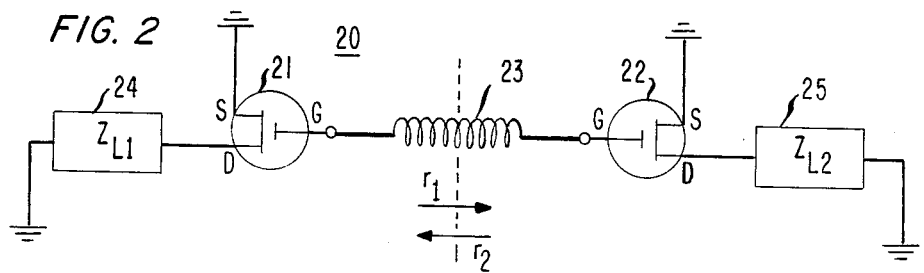
FIG. 2 is a block-schematic diagram of an embodiment of the present invention which provides two output signal ports.

Refer now to FIG. 2 which shows a dual output port oscillator having increased output power. As shown, oscillator circuit 20 includes two FETS, designated as 21 and 22. The gate (G) terminals of FETS 21 and 22 are interconnected via path 23 which provides a delay equal to an integer multiple of the oscillator output signal period. Accordingly, the phase angle between the reflected and output oscillator signals is zero. The source (S) terminals of FETS 21 and 22 are connected to ground and the drain terminals (D) are respectively connected to output load elements 24 and 25 whose impedances are respectively designated as $Z_{L1}$ and $Z_{L2}$. Such a dual output port arrangement is useful in multiple feed antenna systems wherein an oscillator supplies its output to different antenna feeds.

Figure 3:
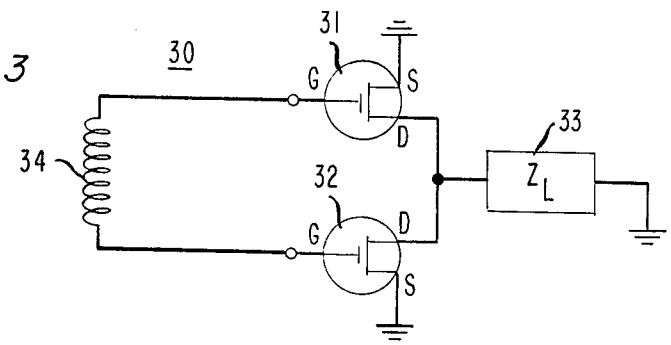
FIG. 3 is a block-schematic diagram of an embodiment of the present invention which provides a single output signal port.
Figure 4:
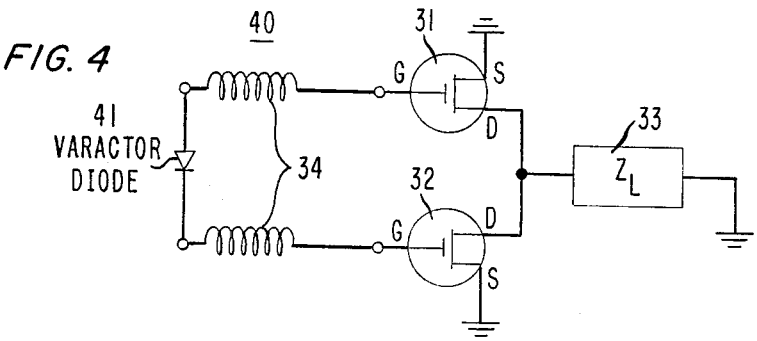
FIG. 4 is a block-schematic diagram of an embodiment of the present invention which is similar to FIG. 3 but also provides an output signal whose frequency is voltage dependent.

FIG. 3 shows an oscillator circuit 30 which utilizes two FETS 31 and 32 in an arrangement which provides a single output port. As shown, the drain (D) terminals are connected in parallel to a common output load $Z_L$ in element 33. The source (S) terminals of the FETS are connected to ground and the gate (G) terminals are connected in series via path 34. Path 34 provides a delay equal to an integer multiple of the oscillator output signal period. This arrangement can be modified as shown in FIG. 4 to provide an oscillator 40 whose nominal frequency is voltage controllable. This feature is achieved by the addition of varactor diode 41 in the interconnection path between the gate terminals of FETS 31 and 32. By changing the d.c. bias voltage of varactor 41, oscillator 40 is driven to a nominal frequency such that the delay provided by the series combination of varactor 41 and path 34 is an integer multiple of the inverse of this nominal frequency. While varactor 41 is shown serially connected to path 34, it can also be connected so that one varactor terminal is connected to path 34 and the other terminal is connected to ground.

It should, of course, be understood that while the present invention has been disclosed in reference to specific embodiments, other arrangements should be apparent to those skilled in the art without departing from the spirit and scope of the present invention. First, for example, while in the disclosed embodiments, the drain terminals of the FETS were connected in parallel to the output loads, the gates connected to reactance and the sources connected to ground, this arrangement is merely illustrative. In fact, any of the three terminals on one FET can be connected to the output load, or the reactance, or ground so long as the corresponding terminal on the other FET is connected the same way. Second, the invention is not limited to two FETS but can be expanded to include a plurality of FETS by merely extending interconnection path 23 or 34 to one or more additional FETS. Finally, while the FETS shown in the figures are intended to include any of the varieties of FETS, including IGFETS and MOSFETS, other transistor devices, such as bipolar transistors, can be used. In such case, corresponding terminals on the bipolar transistors would be connected to the output load, reactance and ground.

What is claimed is:

1. An oscillator circuit having a nominal frequency, said circuit comprising
    a plurality of transistor devices each having terminals, each of the terminals on one device having a corresponding terminal on the other devices, and
    an interconnection path connecting a selected one of said terminals on one device to the corresponding terminal on the other devices, said path providing a delay which is an integer multiple of the inverse of said nominal frequency.
2. The circuit of claim 1 wherein another terminal of said one device is connected in parallel to the corresponding terminal on the other devices.
3. The circuit of claim 1 wherein another terminal of said one device and the corresponding terminal on said other devices form different output ports.
4. The circuit of claim 1 wherein said interconnection path includes a varactor.

* * * * *